_(12)_ United States Patent
Mattisson (10) Patent No.: US 7,511,586 B2
(45) Date of Patent: ***Mar. 31, 2009

(54) NOISE GENERATOR

(75) Inventor: Sven Mattisson, Bjärred (SE)

(73) Assignee: Telefonaktiebolaget L M Ericsson (PUBL), Stockholm (SE)

( * ) Notice: Subject to any disclaimer, the term of this patent is extended or adjusted under 35 U.S.C. 154(b) by 242 days.

This patent is subject to a terminal disclaimer.

(21) Appl. No.: 10/550,827

(22) PCT Filed: Mar. 19, 2004

(86) PCT No.: PCT/EP2004/002904

§ 371 (c)(1),
(2), (4) Date: Sep. 23, 2005

(87) PCT Pub. No.: WO2004/086602

PCT Pub. Date: Oct. 7, 2004

(65) Prior Publication Data

US 2006/0186957 A1    Aug. 24, 2006

Related U.S. Application Data

(60) Provisional application No. 60/459,447, filed on Mar. 31, 2003.

(30) Foreign Application Priority Data

Mar. 26, 2003    (EP)    .................................. 03006904

(51) Int. Cl.
*H03B 29/00*    (2006.01)

(52) U.S. Cl. ........................... 331/78; 708/251; 708/255
(58) Field of Classification Search .................. 331/78; 708/251, 255
See application file for complete search history.

(56) References Cited

U.S. PATENT DOCUMENTS

| 5,398,144 | A |   | 3/1995  | Brannon |
| 5,483,194 | A |   | 1/1996  | Genest |
| 5,627,775 | A |   | 5/1997  | Brown et al. |
| 5,961,577 | A |   | 10/1999 | Soenen et al. |
| 6,061,702 | A | * | 5/2000  | Hoffman .................... 708/251 |
| 6,064,257 | A | * | 5/2000  | Sauer .............................. 330/9 |
| 6,147,552 | A |   | 11/2000 | Sauer |
| 6,759,904 | B2| * | 7/2004  | Behzad ....................... 330/254 |

OTHER PUBLICATIONS

European Patent Office; International Search Report for PCT/EP2004/002904 dated Aug. 16, 2004.

* cited by examiner

*Primary Examiner*—Robert Pascal
*Assistant Examiner*—James E Goodley
(74) *Attorney, Agent, or Firm*—Michael Cameron (57) ABSTRACT

A device for generating a noise signal, which may be used for generating a truly random sequence (10) of bits is disclosed. The device comprises a noise source (11), and an amplifier (12) connected to the noise source (11). The device according noise source according to the invention is protected from interfering signals to provide high noise-interference ratio. Further, the present invention relates to an integrated circuit and an electronic apparatus comprising the device for generating a noise signal according to the invention.

19 Claims, 8 Drawing Sheets

NOISE GENERATOR

This application claims the benefit of U.S. Provisional Application No. 60/459,447, filed Mar. 31, 2003, the disclosure of which is fully incorporated herein by reference.

TECHNICAL FIELD

The present invention relates to a device for generating a seed for a random sequence or bits. More specifically, the invention relates to a noise source being protected from interfering signals so as to provide a truly random seed, which may be utilized for generating random bits.

DESCRIPTION OF RELATED ART

Random numbers or bits are usually of the pseudo-random (PN) type, generated by feedback shift registers. Such a PN sequence is deterministic and cyclic, but with a long enough cycle it appears to be random when taking a snap-shot at a random time interval. By seeding the PN generator with a truly random value, the PN code will have better statistical properties. Such a seed can be generated from e.g. thermal noise, which in principle is random. Due to circuit imperfections, the thermal noise will contain cycles, such as spurious signals and clock feed-through, rendering it less than optimal for stand-alone use as a random generator. By combining the thermal noise source with a shift register and employing further signal processing a better result can be obtained.

Noise devices typically consist of an amplified thermal noise source, a noisy oscillator or a chaotic feedback circuit. The thermal noise is derived from either a high-ohmic resistor or a reverse-biased PN junction (where some breakdown mechanism is often exploited). The oscillators are typically relaxation based or ring oscillators, because of their inferior frequency stability.

"An Integrated Analog/Digital Random Noise Source", IEEE Transactions on Circuits and Systems I: Fundamental Theory and Applications, 44(6): 521-528, June 1997,by W. Timothy Holman, J. Alvin Conolly, and Ahmad B. Dowlatabadi, discloses an analog/random noise source. A large resistor is utilized as a thermal noise generator. The resistor is coupled to an operational amplifier for amplifying the weak noise, wherein the amplified noise signal is fed to the noninverting input of a comparator, and to the inverting input of the comparator via a low-pass filter to remove DC and low frequency components. The comparator will generate a digital random output based on the noisy input signals.

"A Noise-Based IC Random Number Generator for Applications in Cryptography", IEEE Transactions on Circuits and Systems I: Fundamental Theory and Applications, 47(5): 615-621, May 2000, Craig S. Petrie and J. Alvin Conelly, discloses a random number generator. Noise from a noise device comprising a noise source, a low pass filter and a 1/f filter is amplified and fed to the input of a sample and hold circuit, via a limiter, and finally to a current controlled oscillator generating random output. Two 50-ohm n-well input resistors are used to generate a predictable level of thermal noise.

The solutions according to the known prior art utilize operational amplifiers, wherein the sizing of the amplifiers are not designed for high noise/interference ratio, but rather for conventional sizing parameters, such as current, driving capability, inherent noise etc. Also, no protection of the noise generators from interference is provided.

The disadvantage with the above solutions is in the generation of thermal noise as a seed for generating a random sequence of bits, where the methods are not well suited for digital CMOS technology. The resistor values have to be high, which means that their area is large if they are implemented on an integrated circuit resulting in a proneness to pick up substrate and other capacitively coupled interference. Further, not all CMOS technologies provide suitable resistors. The reverse biased PN junction used as a noise source often rely on carrier multiplication to amplify the noise, resulting in high noise levels, which are noisy with a wide noise bandwidth. Unfortunately no suitable junction with a low enough breakdown voltage is available in a standard digital ASIC technology.

SUMMARY OF THE INVENTION

One object of the present invention is to provide a device for generating a truly random seed for generating a random sequence of bits. Also, it is an object to provide a device for generating a random seed for generating a random sequence of bits having fast settling time when switched on.

A device for generating a noise signal having a high noise/interference ratio comprising a noise source and an amplifier achieves the above objects. The device according to the invention has a design, wherein the noise source is protected from interfering signals. Moreover, intrinsic noise from a MOS transistor is utilized as the noise source, which is protected from interfering signals by means of a load connected to supply and said noise transistor, and a tail-current source connected to said noise transistor and grounding means. All of these components together form a noisy amplifier. The noise from the noisy amplifier is further amplified in an amplifier chain. A DC feedback filter together with the symmetry between the noisy amplifier and a following first amplifier cell provides fast settling time, as noise will be available before the feedback filter has settled.

In one embodiment of the invention, the output of the amplifier chain is utilized as a bias source for an oscillating means. In response to modulating the bias of the oscillating means, said oscillating means will generate a truly random output.

It is a further object of the invention to provide an integrated circuit comprising a device for generating a truly random seed for generating a random sequence of bits.

This object is achieved by an integrated circuit comprising a device for generating noise signal having high noise/interference ratio, comprising a noise source and an amplifier. In one embodiment of the invention, all components of the device are implemented using standard CMOS technology, wherein the noise source is protected from interfering signals.

Still another object of the invention is to provide an electronic apparatus comprising a device for generating a random seed for generating a random sequence.

This object is according to the invention achieved by an electronic apparatus comprising a device for generating a noise signal having high noise/interference ratio, comprising a noise source, and an amplifier connected to the noise source, wherein the noise source is protected from interfering signals. Moreover, according to the invention, the noise is utilized as the bias source of the oscillating means.

An advantage of the present invention is that high noise/interference ratio is provided, wherein a truly random seed for generating a random sequence of bits may be generated. Further, all circuit blocks of the device according to the invention, including resistors and capacitors can be provided with CMOS technology. All tolerances are relaxed and only relative matching is important, making it compatible with on-chip implementation. Further, no special noise device, such as a high value resistor or zener diode, is needed as thermal and 1/f noise of regular MOS devices are utilized.

Another advantage of the present invention is that the DC-coupling of the noise amplifier chain avoids shunting of the signal path as well as avoiding introducing interference via parasitic signals from coupling resistors.

The optimized sizing of the device according to the invention has the advantage that the differential structure of the amplifier chain minimizes common-mode induced interference. Further, connecting the load to the supply, maximizing the impedance path from Vdd to ground by employing cascode PMOS loads and NMOS tail-current sources minimizes the coupling paths from supply, ground, and substrate. Further, utilizing the same basic amplifier cell (having optimized device sizing) for the noisy amplifier and at least one amplifier cell of the amplifier has the advantage that no inter-stage coupling resistors are needed, which will further increase the noise level, and consequently the noise/interference ratio.

It is a further advantage of the present invention that the device for generating the seed may be used as a stand-alone noise source, and is therefore suitable as an integrated component in any electronic equipment wherein a noise source is employed.

Further preferred features of the invention are defined in the dependent claims.

It should be emphasized that the term "comprises/comprising" when used in this specification is taken to specify the presence of stated features, integers, steps or components but does not preclude the presence or addition of one or more other features integers, steps components or groups thereof.

BRIEF DESCRIPTION OF DRAWINGS

Embodiments and various other aspects of the present invention will now be described in more detail, reference being made to the accompanying drawings, in which.

DETAILED DESCRIPTION OF EMBODIMENTS

Figure 1:
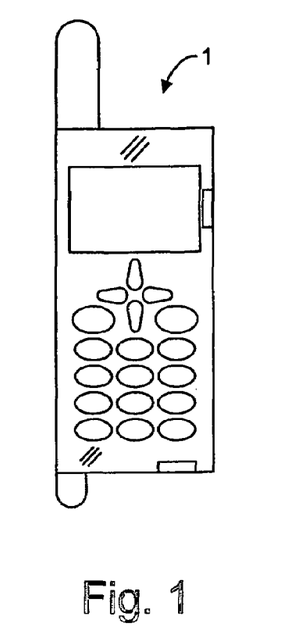
FIG. 1 illustrates a mobile telephone comprising a device for generating a noise signal.

FIG. 1 illustrates an electronic apparatus embodied as a mobile telephone 1, wherein the present invention is employed. However, the invention is not limited to a mobile telephone 1, but can be implemented in any electronic equipment employing a noise source. The mobile telephone 1 comprises various circuitry for communicating with other electronic apparatuses through e.g. a mobile telecommunication network. The electronic apparatus may also be embodied as a mobile radio terminal, a pager, a communicator, such as an electronic organizer or a smartphone, etc. For providing secure communication, the mobile telephone 1 comprises a cryptographic block, which may be utilized for encryption and decryption, respectively. Consequently, the mobile telephone 1 is adapted to provide cryptographic functions, which are known per se. A device for generating a noise signal is according to one embodiment of the invention provided as an integrated circuit together with other functional blocks, such as the cryptographic block, to form an ASIC (application specific integrated circuit) incorporated into the mobile telephone 1.

Figure 2:
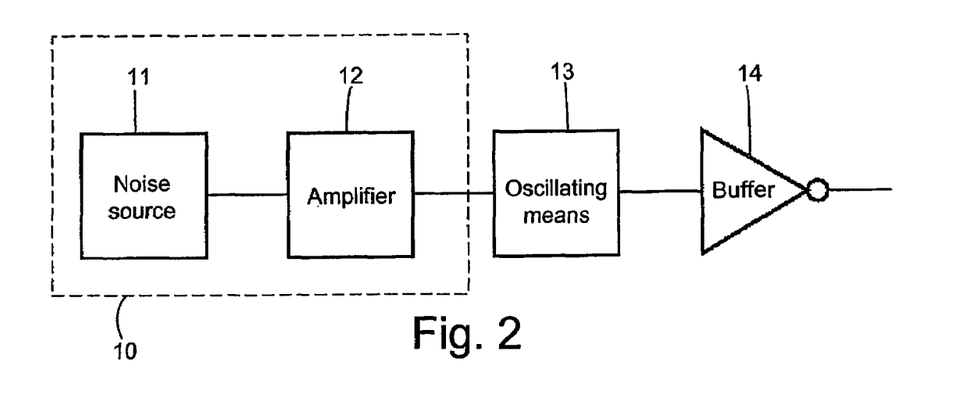
FIG. 2 illustrates the principle of the device for generating a noise signal, and an exemplifying oscillating means.

FIG. 2 illustrates the principle of a device for generating a random sequence of bits comprising the device 10 for generating a noise signal according to the invention. The device 10 comprises a noise source 11 having an output terminal connected to the input terminal of an amplifier 12. The output terminal of the amplifier 12 is in one exemplifying embodiment connected to an input terminal of an oscillating means 13, such as a voltage controlled oscillator (VCO), for generating a continuous bit stream with a lot of jitter and a frequency that is independent of the clock system of the mobile telephone 1. The output of the oscillating means 13 is in turn in this embodiment connected to the input of a buffer 14, such as a low-fanout buffer.

The noise source 11 generates a weak wide-band noise signal, which is amplified by the amplifier 12 to approach a specific voltage, such as 100 mV$_{RMS}$. However, the value is not critical and has to be tested and evaluated in each specific configuration. The noise amplified by the amplifier 12 is according to one exemplifying embodiment of the invention utilized to modulate the oscillating means 13, as will be further described below. The oscillating means 13 will as a consequence generate a continuous bit stream with a lot of jitter and a frequency that is independent of the clock system, and which is buffered by the buffer 14.

Figure 3:
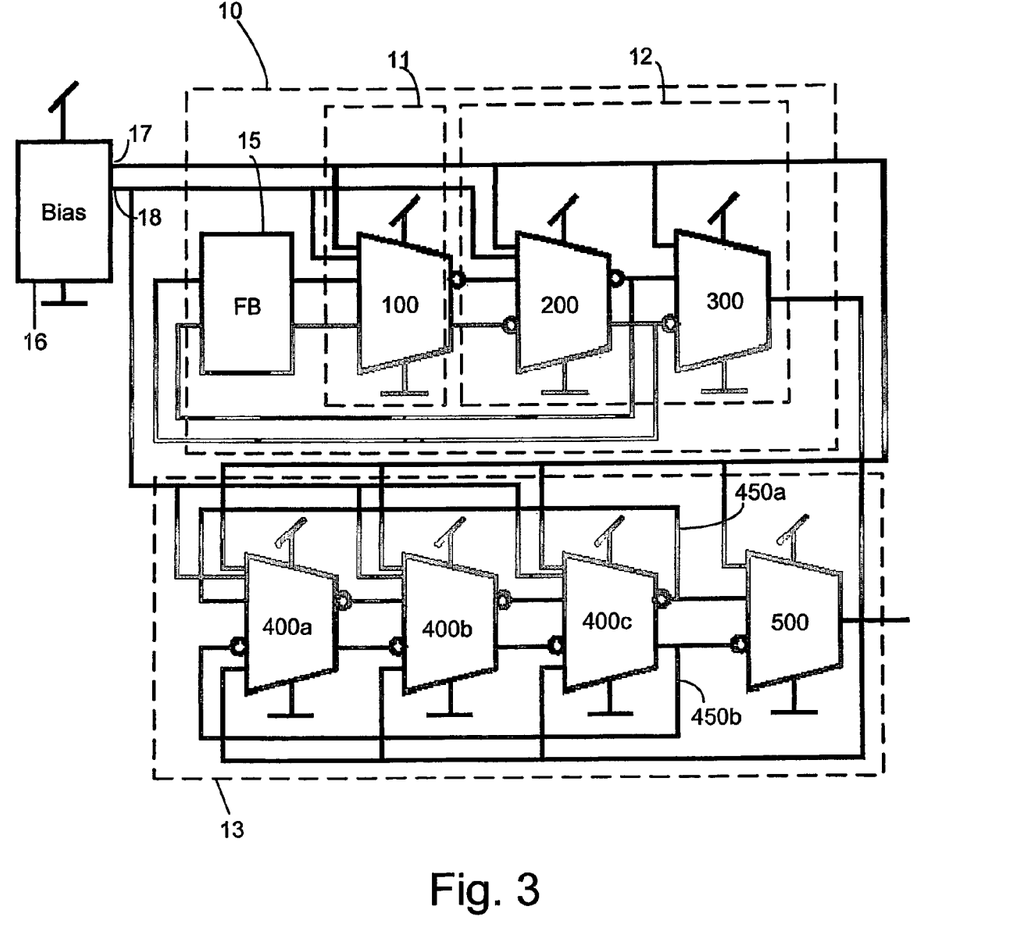
FIG. 3 is a more detailed illustration of one embodiment of the device for generating a noise signal according to FIG. 2.

FIG. 3 illustrates a more detailed embodiment of the device for generating a noise signal 10 according to the invention. The noise source 11 comprises a noisy amplifier 100, the amplifier 12 comprises first and second cascaded amplifier cells 200, 300, respectively, which are DC-coupled, and the exemplifying oscillating means 13 comprises three oscillator amplifiers 400a, 400b, 400c and one differential amplifier 500. Also, said device 10 is connected to a feedback filter 15 and a bias means 16 having first and second output terminals 17, 18 supplying first and second biases bias$_1$ and bias$_2$, respectively.

According to the invention, thermal and/or 1/f noise is used as the noise source. In the preferred embodiment of the invention, intrinsic noise from a MOS transistor is utilized as the noise source 11 generating thermal noise. Also, 1/f noise from a following amplifier as will be described below will be utilized to further improve the noise characteristics of the device according to the invention. However, the intrinsic noise is very weak, $V_n^2 \sim kT/C_{gs}$, wherein k is Boltzman's constant, T is absolute temperature, and $C_{gs}$ is the gate-source capacitance of the transistor. Also, to provide truly random noise the noise source has to be protected from interfering clock signals, which may enter the noise source via the supply and bias lines and through the substrate of the ASIC, in which the device for generating a noise signal 10 is incorporated.

Because of the low noise levels available in a MOS transistor, the amplifier 12 amplifies the noise generated by the noise source 11. The amplifier 12 accomplishes the amplification by augmenting the noise using the amplifier chain, which comprises a number of amplifier cells 200, 300. The amplifier cells are preferably of the same type as the noise source 11. The noise source 11 is really an amplifier with no input signal, as will be explained below. According to one embodiment of the invention, all elements of the noise source 11 and the amplifier 12 may be built around the same basic amplifier cell 600, as will be explained below.

Figure 4:
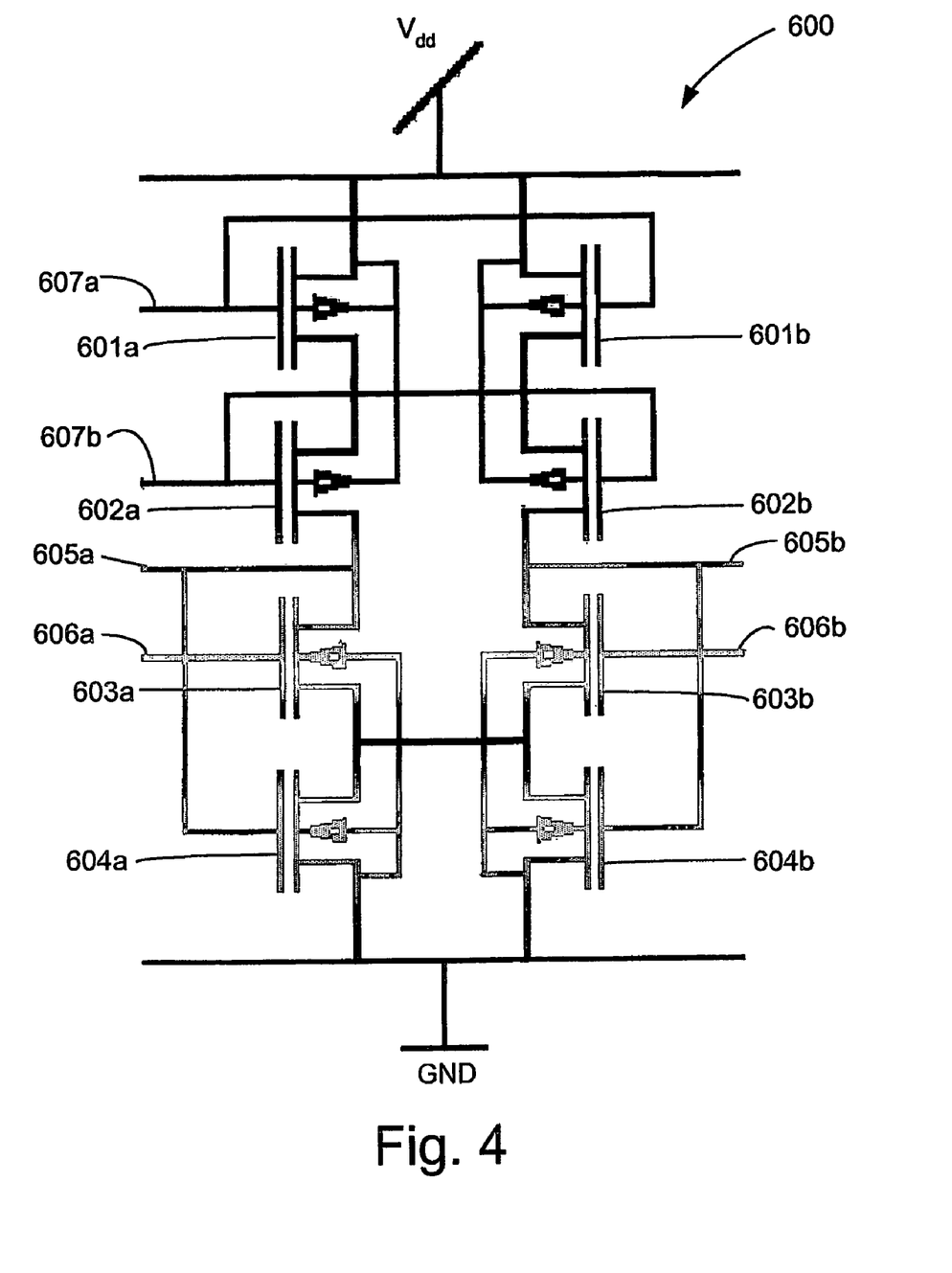
FIG. 4 is an illustration of a basic amplifier cell according to the invention.

FIG. 4 illustrates the basic amplifier cell 600 of the present invention, wherein the amplifying devices, including the noise source, are protected from interfering signals. A MOS transistor itself is utilized as the amplifying device. An amplifier having high power gain is preferred, as the intrinsic noise is very weak. Therefore, a common source amplifier is utilized according to the preferred embodiment, as this is the configuration having the highest power gain. The MOS transistor will be very small on the integrated circuit and interfering signals and fields will have the same magnitude and orientation for neighboring devices of the amplifying device. By using a differential topology of the amplifying device, such interference will appear as common-mode (CM) signals, which may be suppressed by optimizing the circuit and layout symmetry, as will be explained in the following.

The basic amplifier cell 600 shown in FIG. 4, comprises a first transistor pair, 601a, 601b, a second transistor pair 602a, 602b, a third transistor pair 603a, 603b, and a fourth transistor pair 604a, 604b. The first and second transistor pairs, 601a, 601b, 602a, 602b, are according to one embodiment of the invention PMOS devices acting as a load of the common source amplifier. The third and fourth transistor pairs, 603a, 603b, 604a, 604b are in one embodiment NMOS devices, wherein the third transistor pair 603a, 603b, are the common-source amplifier and the fourth transistor pair 604a, 604b are tail-current sources.

The PMOS transistors 601a, 601b, 602a, 602b utilize common bias, whereis the gates of first transistor pair 601a, 601b are connected to the first bias $bias_1$ via a first bias terminal 607a, and the gates of the second transistor pair 602a, 602b are connected to the second bias $bias_2$ via a second bias terminal 607b. The sources and bulks of the first transistor pair 601a, 601b, are connected to supply ($V_{dd}$). The drains of the first transistor pair 601a, 601b are connected to the sources of the second transistor pair 602a, 602b, respectively.

The drains of the second transistor pair 602a, 602b, are connected to the drains of the third transistor pair 603a, 603b, respectively, and the gates of the fourth transistor pair 604a, 604b, respectively. The bulks of the third and fourth transistor pairs 603a, 603b, 604a, 604b are connected to a grounding means, such as the substrate on which the basic amplifier cell 600 is implemented. The sources of the third transistor pair 603a, 603b are connected to the drains of the fourth transistor pair 604a, 604b, respectively. Also, the sources of the third transistor pair 603a, 603b are short-circuited. The sources of the fourth transistor pair 604a, 604b are connected to the grounding means. The gates of the fourth transistor pair 604a, 604b connected to the drains of the second transistor pair 602a, 602b, respectively, are also connected to first and second output terminals 605a, 605b, respectively. The gates of the third transistor pair 603a, 603b are connected to first and second input terminals 606a, 606b, respectively.

To maximize the common mode rejection ratio (CMRR) and the power supply rejection ratio (PSRR), the differential amplifier of the basic amplifier cell 600, i.e. the third transistor pair 603a, 603b, and the tail-current sources, i.e. the fourth transistor pair 604a, 604b are connected to the grounding means. Said tail-current sources provide common mode feedback setting the NMOS tail-current sources 604a, 604b to an appropriate quiescent point. Therefore, it is vital to have a very high-impedance path (load) from the third transistor pair 603a, 603b to $V_{dd}$. In the embodiment of FIG. 4, the cascoded PMOS transistors of the first and second transistor pairs 601a, 601b, 602a, 602b provide this load. In an integrated circuit it is inevitable that the supply voltage will carry interference signals in the order of 10-100 mV with even larger spikes. By maximizing the load impedance, the $V_{dd}$-induced interference current entering the NMOS transistors of the third and fourth transistor pairs 603a, 603b, 604a, 604b is minimized. The cascoded PMOS load has been chosen according to the preferred embodiment of the present invention.

The mismatches between the PMOS transistors of the first transistor pair 601a, 601b connected to $V_{dd}$ are suppressed by the cascoded coupling of the first and second transistor pair, as shown in FIG. 4, wherein the load impedance is maximized. Therefore, the interference current entering the third and fourth transistor pair 603a, 603b, 604a, 604b will be minimized.

In an alternative embodiment, the polarity of the basic amplifier cell 600 is changed, wherein the first and second transistor pairs 601a, 601b, 602a, 602b are replaced by NMOS transistors, and the third and fourth transistor pairs 603a, 603b, 604a, 604b are replaced by PMOS transistors.

In still another embodiment, the transistors of the basic amplifier cell 600 are provided as bipolar junction transistors (BJT). The tail-current sources may in another embodiment be provided as resistors. Providing the tail-current sources with resistors may cause an unstable operating point. Therefore an additional bias means (not shown) is provided to control the quiescent point when resistors are utilized to provide the tail-current sources. Also, in an alternative embodiment the loading of the third and fourth transistor pairs 603a, 603b, 604a, 604b are provided by resistors (not shown).

In an alternative embodiment, any mismatch between the first transistor pair 601a, 601b is eliminated by shorting their drain terminals (not shown). Consequently, interference from $V_{dd}$ entering the first transistor pair 601a, 601b will pass said transistors cophasally, wherein their drain potentials are equal if they are perfectly matched. Hence, a short-circuiting between the drains of the first transistor pair 601a, 601b may be provided. Said short-circuiting entails that any mismatch between the first transistor pair 601a, 601b, will not be visible for the second transistor pair 602a, 602b. For a differential signal the drain potentials are not equal without the short-circuiting of said drains, wherein no signal grounding is provided at the drains. However, providing the short-circuiting will provide a virtual grounding point for differential signals, whereby the differential output impedance, and consequently the differential load impedance gain, will be lowered. After taking care of the mismatch between the first transistor pair 601a, 601b by short-circuiting the drains of said transistors, the mismatch between the remaining two PMOS transistors of the second transistor pair 602a, 602b, and the NMOS transistors of the third transistor pair 603a, 604a, will be left as a source of limited common mode rejection ratio (CMRR). From a common mode perspective, the load impedance does not suffer from a parallel connection, but the differential load impedance does, as set out above. With the transistors of the first and second transistor pair 601a, 601b, 602a, 602b in parallel, i.e. 601a in parallel to 601b and 602a in parallel to 602b, the NMOS transistors of the third and fourth transistor pair 603a, 603b, 604a, 604b experience a low-frequency load each of $g_{ds603}+g_{ds602}$, when the drains of the first transistor pair 601a, 601b are short-circuited (not shown). However, when the first and second transistor pair 601a, 601b, 602a, 602b are connected as in the first embodiment shown in FIG. 4 each load of the NMOS transistors of the third and fourth transistor pair 603a, 603b, 604a, 604b will be roughly $g_{ds603}+$ $g_{ds602} \cdot g_{ds601}/g_{m602}$ resulting in a higher differential gain, $g_m$ being the transconductance of the transistor. As should be noticed, according to another embodiment of the invention (not shown), the loading, i.e. the first and second transistor pair 601a, 601b, 602a, 602b, of the NMOS transistors of the third and fourth transistor pairs 603a, 603b, 604a, 604b can be provided with resistors.

Connecting the gates of the tail current sources, i.e. the fourth transistor pair 604a, 604b, to the output terminals 605a, 605b (and consequently to the drains of the second transistor pair 602a, 602b) would normally force said fourth transistor pair into the triode region. However, by sizing the length-over width ratio between the third and forth transistor pair 603a, 603b, 604a, 604b appropriately the fourth transistor pair 604a, 604b will almost be in the pentode region even when the back-gate effect of the third transistor pair is considered. Also, adding several substrate contacts around the transistors and by maximizing the layout symmetry the CMRR will be high enough while the interference between the ground and substrate is short-circuited. According to the preferred embodiment, the PMOS transistors and the NMOS transistors of the basic amplifier cell 600 are sized in the same way to simplify bias. Therefore, the sizing of the transistors, i.e. the width-over-length ratio Z, are according to the preferred embodiment provided as:

$$\frac{Z_{602}}{Z_{601}} = \frac{Z_{603}}{Z_{604}} \approx 10 \quad \text{(Equ. 1)}$$

However, in another embodiment the relationship may be different as long as it is substantially greater than 1, preferably greater than 3. If the above relationship is not met, the transistors. 601a-604b of the basic amplifier cell can not have common bias without forcing the transistors, which are connected to the grounding means or $V_{dd}$ (i.e. the first transistor pair 601a, 601b, and the fourth transistor pair 604a, 604b) into the linear region providing a lower impedance. However, other relationships of the sizing may in alternative embodiments be >10 and still use common bias. The ratio 10 is chosen for reasons that will be further discussed below. Also, in still another alternative embodiment, split bias is provided, wherein it is not necessary to meet the above relationship.

Since $v_n^2 \sim kT/C$ and the capacitance $C \sim C_{gs603}$, wherein $C_{gs603}$ is the gate-source capacitance of the third transistor pair 603a, 603b, it is preferred to keep the transistors as small as possible so as to keeping the interference low, while still getting a good enough matching. Further, the output terminals 605a, 605b, respectively, will each be loaded by $C_{gd603}$+$C_{gd602}$+$C'_{gs603}$, wherein $C'_{gs603}$ is the input capacitance of the following stage, which will be sized in the same way. Also, it is advantageous to minimize the sizing of the PMOS transistors 601a, 601b, 602a, 602b of the basic amplifier cell 600 to minimize the interference entering the third transistor pair 603a, 603b.

According to the present invention, in addition to maximizing the noise level it is preferred to maximize the noise/interference ratio ($i_n^2/i_I^2$), i.e. keeping the interfering signals as low as possible. The noise level may be approximated as:

$$i_n^2 \approx \frac{kT}{C_{gs}} g_m^2, \quad \text{(Equ. 2)}$$

wherein $$g_m^2 \approx \left[\mu C_{ox} \frac{W}{L}(V_{gs} - V_T)\right]^2 \approx 2\mu C_{ox} \frac{W}{L} I_{ds}. \quad \text{(Equ. 3a)}$$

$$C_{gs} = \frac{2WLC_{ox}}{3} \quad \text{(Equ. 3b)}$$

By combining equations 2, 3a and 3b we get:

$$i_n^2 \approx \frac{3kT \cdot 2\mu C_{ox} WI_{ds}}{2WLC_{ox}L} = 3kT\mu \frac{I_{ds}}{L^2}, \quad \text{(Equ. 4)}$$

where the noise level is expressed as a function of the channel length L of the transistor and quiescent current $I_{ds}$. In the above equations $C_{ox}$ represent the oxide capacitance, k is Bolzman's constant, T is absolute temperature, µ is mobility, W is the channel width of the transistor, $V_T$ is the threshold voltage, and $V_{gs}$ is the gate-source voltage. As can be seen from Equ. 2-4, increasing the gate over drive voltage ($V_{gs}$-$V_T$) will increase the transconductance (Equ. 3a), which in turn will increase the noise current (Equ. 2).

The interference entering the basic amplifier cell 600, and the noise source 11 as will be explained in the following, will be proportional to the single-ended noise coupling times the mismatch. The single-ended noise coupling is dependent on the impedance between the interfering source, such as $V_{dd}$, grounding means, etc., and the signal nodes. Maximizing the impedance utilizing the topology choice of the cascoded first and second transistor pair 601a, 601b, 602a, 602b and providing device sizing according to Equ. 1 above, which will maximize the load impedance, will minimize the single-ended noise coupling.

The mismatch part of the basic amplifier cell 600 is important for keeping the interference as low as possible. The actual channel length L and channel width W of the transistor are technology dependent, but by keeping the ratios between the components of the basic amplifier cell 600 according to Equ. 1 performance will be sufficiently robust to technology variations and bias conditions. According to one embodiment of the present invention, CMOS integrated circuits having the following characteristics are utilized for the basic amplifier cell 600:

$$\sigma_{V_{T-2}} nV/\sqrt{W \cdot L_{eff}} \quad \text{(Equ. 5)}$$

$$\sigma_{KP} \sim 0.02 \text{ ppm}/\sqrt{W \cdot L_{eff}} \quad \text{(Equ. 6)}$$

$$L_{eff} = L - 0.085 \text{ µm} \quad \text{(Equ. 7)}$$

wherein $\sigma_{V_t}$ is the threshold voltage mismatch, $\sigma_{KP}$ is the gain mismatch, and $L_{eff}$ is the electrical channel length.

By utilizing Equ. 5-7 the relative quiescent current $I_{ds}$ mismatch is approximated by:

$$\sigma_{gm}^2 \approx \sigma_{KP}^2 + \frac{\sigma_{V_T}^2}{(V_{gs} - V_T)^2} = \frac{1}{W \cdot L_{eff}} + \left[\left(2\%(\mu m)^2 \left(\frac{2mV\mu m}{V_{gs} - V_T}\right)^2\right)\right] \quad \text{(Equ. 8)}$$

When $V_{gs}$-$V_T \approx 100$ mV, the gain (KP) and threshold voltage ($V_T$) mismatches are of equal size. This is the lowest useful operating point of the basic amplifier cell 600 since matching will degrade with a low gate over-drive voltage $V_E = V_{gs} - V_T$, as a too short channel length L for a given current will decrease $V_E = V_{gs} - V_T$, thus increasing the $I_{ds}$ mismatch (see Equ. 8). At lower gate-over-drive voltages, $V_{gs}$ and $V_T$ will be of approximately equal size, wherein a relative variation of $V_E$ caused by a variation of $V_T$ will be larger. Hence a low gate-over-drive voltage will lower the transconductance, which in turn will lower the noise level and increase the quiescent current mismatch.

The interference current $i_I$ is proportional to the mismatch σ, and therefore the noise/interference ratio can be defined, $$\frac{i_n^2}{i_I^2} \propto \frac{3kT\mu I_{ds}}{L^2 \sigma^2} \propto I_{ds} \frac{W}{L}, \quad \text{(Equ. 9)}$$

which shows that for a given bias current budget $I_{ds}$, we need to make the devices short and wide. In the preferred embodiment where $V_E = V_{gs} - V_T \approx 100$ mV, the current is set by choosing the appropriate channel width of the transistor.

Minimum length transistors have a very high output conductance (low open circuit voltage gain). Therefore, it is preferred to keep the device sizing to a few integer multiples of the minimum channel length. Based on the above, the sizing of the basic amplifier cell 600 is according to one embodiment:

$$Z_{603} = Z_{602} = \frac{25\mu m}{2.5\mu m} = 10, \quad \text{(Equ. 10)}$$

$$Z_{604} = Z_{601} = \frac{2.5\mu m}{2.5\mu m} = 1.$$

The sizing having a channel length of 2.5 μm according to equation 10 results in a threshold-voltage mismatch of $\sigma_{V_T} \approx 0.25$ mV, and a transconductance mismatch of $\sigma_{KP} \approx 0.25\%$. With a gate-over-drive voltage $(V_E = V_{gs} - V_T)$ exceeding 100 mV, according to above, this would correspond to some 40 dB of attenuation of CM signals. As should be noticed, larger areas of the transistors are possible according to other embodiments of the invention. However, larger gate areas will also reduce the noise level.

In other embodiments, the sizing of the basic amplifier cell is chosen to be within the following ranges:

W603=W602=2.5-125 μm
L603=L602=0.25-12.5 μm
W601=W604=0.25-12.5 μm
L601=L604=0.25-12.5 μm wherein W is the width of the transistors and L is the length of the transistors.

The basic amplifier cell 600 having its inputs operatively connected AC-wise to the grounding means forms the noisy amplifier 100, which is utilized as the noise source 11.

In another not shown embodiment, the inputs of the basic amplifier cell 600 are connected DC-wise to a fixed potential to form the noisy amplifier 100.

Figure 5:
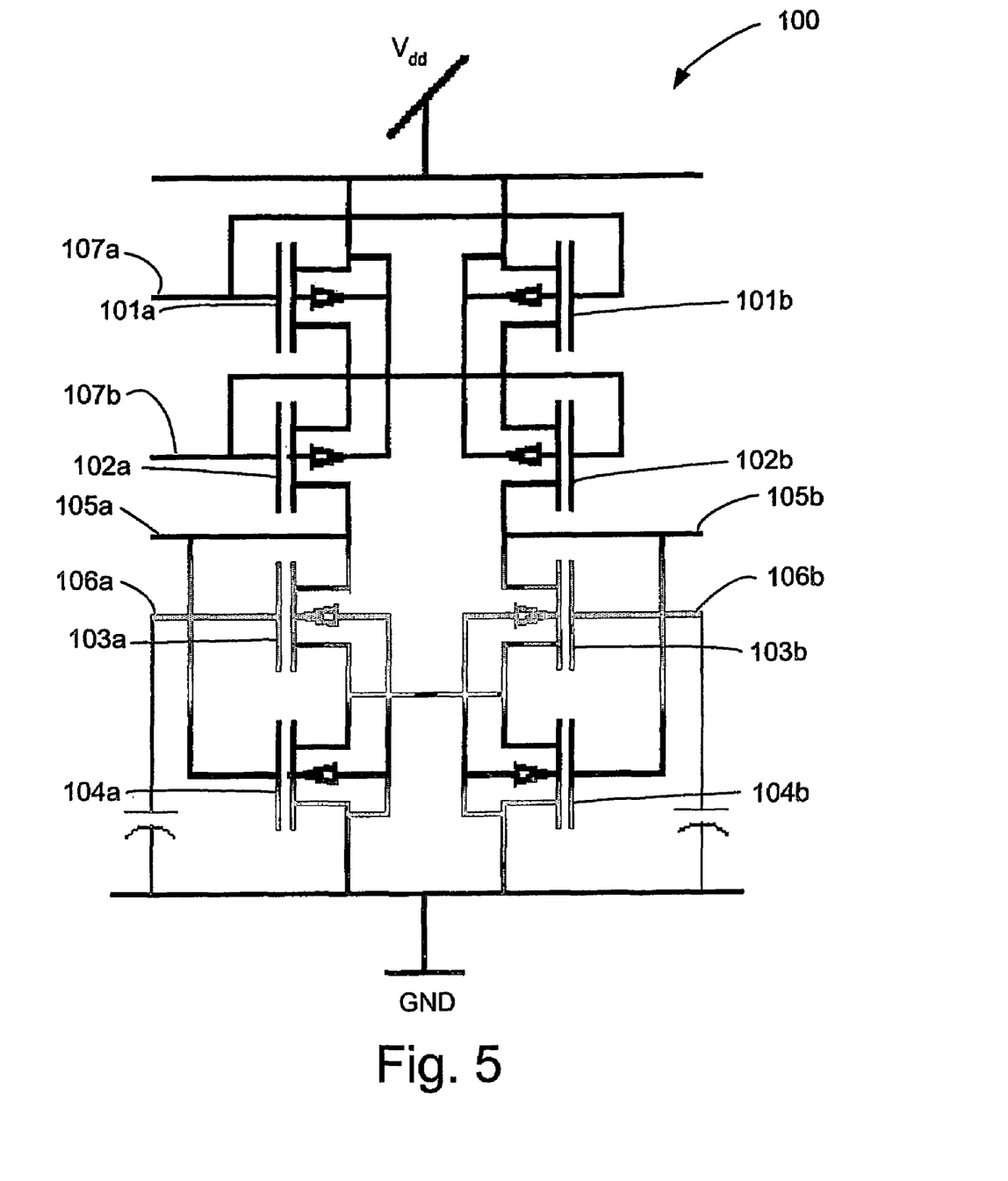
FIG. 5 is a detailed illustration of one embodiment of the noise source embodied as a noisy amplifier.

The intrinsic noise of the MOS transistors of the basic amplifier cell 600 is utilized as the thermal noise by short-circuiting the input terminals 606a, 606b of the basic amplifier cell 600 AC-wise to the grounding means. In FIG. 5, the noisy amplifier 100 according to one embodiment of the invention is shown. The noisy amplifier 100 corresponds to the basic amplifier cell 600 with the above modifications. Therefore, like components of the basic amplifier cell 600 and the noisy amplifier 100 are denoted by the like numerals. Consequently, the first transistor pair 601a, 601b of the basic amplifier cell 600 corresponds to a first transistor pair 101a, 101b of the noisy amplifier 100, etc. By connecting the input terminals 106a, 106b, of the noisy amplifier 100 to grounding means, each output terminal 105a, 105b, will generate a noise current $$i_n^2 \sim 4kTBg_m \approx kT/C_{gs} \cdot g_m^2 \approx \frac{3}{8}kTC_{ox}(V_{gs} - V_T)2Z^2/A,$$

wherein B is the noise band width, Z is the channel width-over-length ratio, and A is the channel area. Consequently, the smaller the devices, the smaller $C_{gs}$ will be and the higher the noise level generated. However, too small a device size will cause mismatches, as the matching will degrade with a low gate-over drive voltage, as set out above.

The amplifier 12 comprises the two cascaded amplifier cells 200, 300. The design of the first amplifier cell 200 corresponds to the basic amplifier cell 600 described above, and the second amplifier 300 is a differential amplifier, which will be further described in the following. The details of the first amplifier cell 200 are disclosed in FIG. 6a. Like numerals of the basic amplifier cell 600 and the amplifier cell 200 are denoted by the like numerals, as have been described above in connection to the noisy amplifier 100. The output terminals 105a, 105b of the noisy amplifier 100 are connected to the input terminals 206a, 206b of the first amplifier cell 200, respectively. Further, the noisy amplifier 100 and the first amplifier 200 utilize the same biases, bias$_1$, bias$_2$, as has been described above with reference to the basic amplifier cell 600.

Figure 6A:
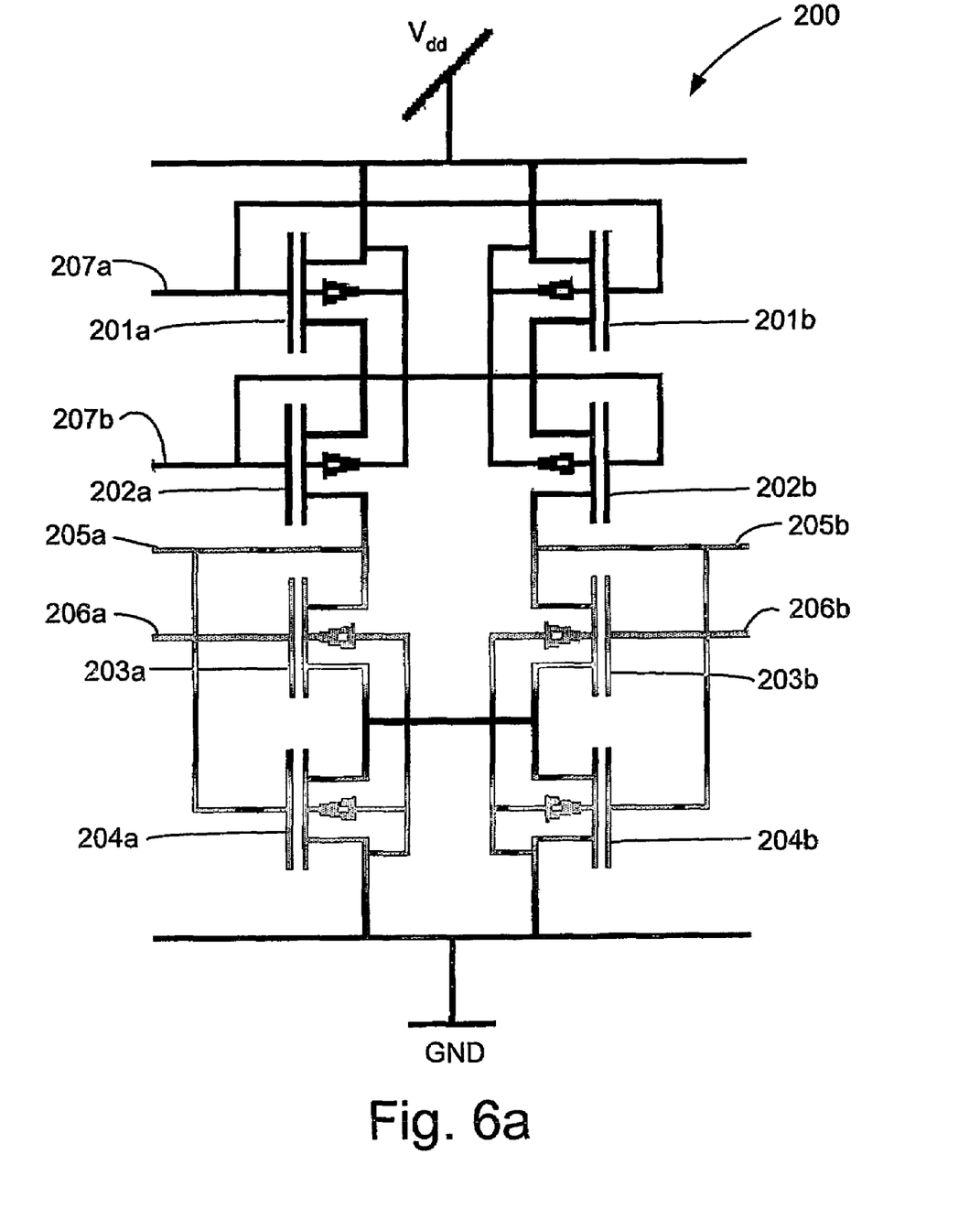
FIG. 6a is a detailed illustration of one embodiment of a first amplifier cell of the amplifier of FIG. 2.

The loading of the noise source 11 by the following amplifiers 200, 300 does not reduce the noise too much. This is because the sizing of the first and second amplifiers 200, 300 are substantially similar to that of the noisy amplifier 100, as has been described above with regard to the basic amplifier cell 600.

Figure 6B:
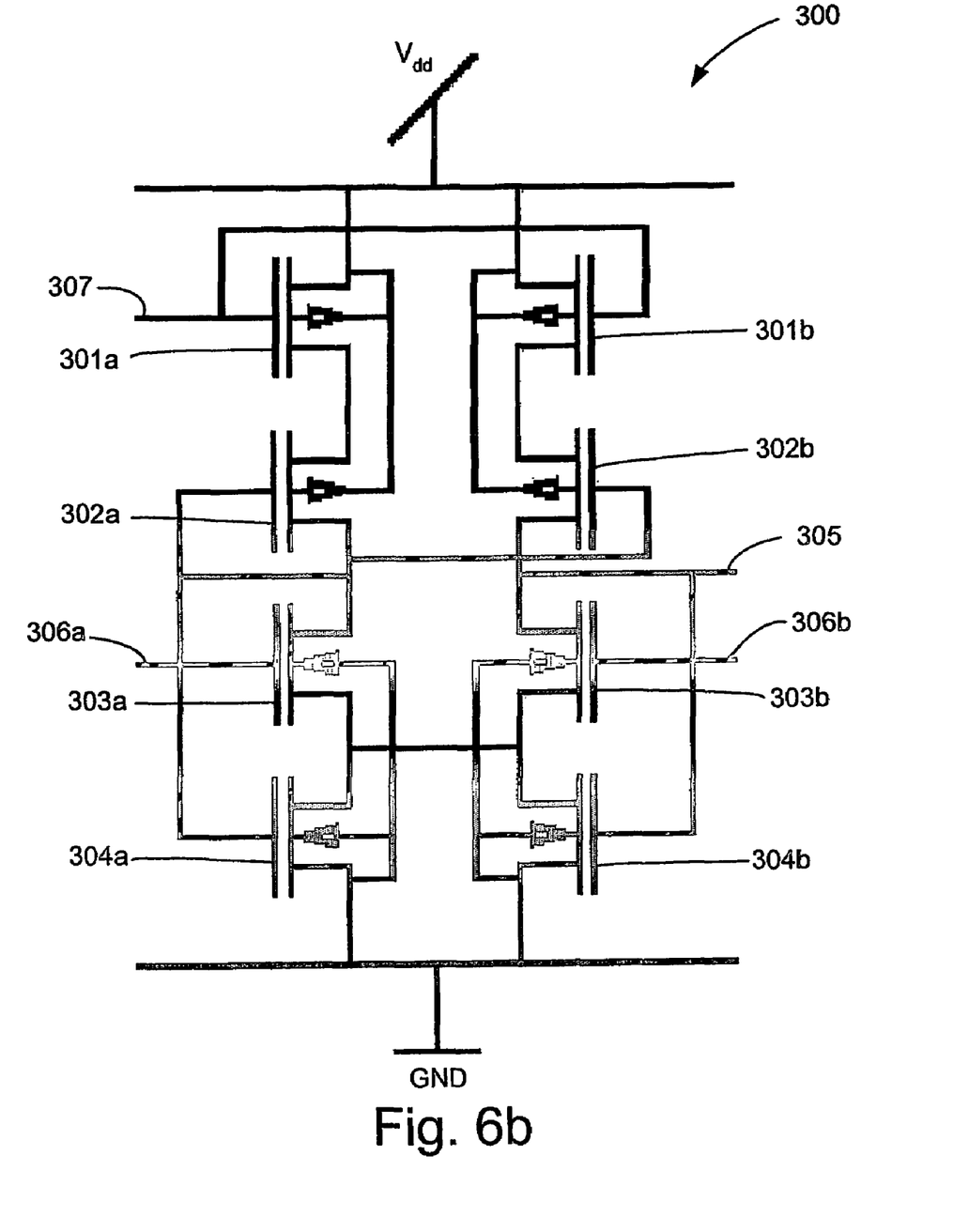
FIG. 6b is a detailed illustration of one embodiment of a second amplifier cell of the amplifier of FIG. 2.

FIG. 6b illustrates the detailed design of one embodiment of the second amplifier 300. Like components of the second amplifier 300, which is a differential amplifier, and the basic gain cell 600 are denoted with like numerals. Consequently, the first transistor pair 601a, 601b of the basic amplifier cell 600 has its equivalence 301a, 301b in the second amplifier 300, etc. The output terminals 205a, 205b of the first amplifier cell 200 are connected to the first and second input terminals 306a, 306b of the second amplifier 300, respectively. The differences between the basic amplifier cell 600 and the second amplifier cell 300 are as follows. All components and connections of the second amplifier cell 300 not discussed below correspond to the basic amplifier cell 600.

Only the first bias bias$_1$ is connected to the second amplifier cell 300 via the bias terminal 307, i.e. to the gates of the first transistor pair 301a, 301b. Further, the connections between the second transistor pair 302a, 302b are different. The gate of the transistor 302b is connected to the drain of the transistor 302a, and the gate of the transistor 302a is connected to the gate of the transistor 304a and its own drain. Also, only one output terminal 305 is provided, which is connected to the connection between the drain of the transistor 302b and the drain of the transistor 303b.

Compensating for differential offsets is according to one aspect of the present invention preferred in order to maximize the differential gain. Consequently, the output noise level, the CMRR and PSRR (power supply rejection ratio) will also be maximized. In the embodiment shown in FIG. 3 a DC-coupled structure has been chosen to compensate for differential offsets and maximize the differential gain. The noise source 11 has been cascaded with the first and second amplifier cells 200, 300 to form a chain with negative differential gain, as the CM gain has to be <1, i.e. negative or smaller than unity to be stable. An amplifier circuit having a CM gain >1 will be unstable with respect to CM voltages and start to self-oscillate cophasally, i.e. the quiescent points will vary causing the differential signal to be zero.

A DC compensation feedback loop is provided, wherein the output terminals 205a, 205b of the first amplifier 200 are connected to the input terminals 106a, 106b of the noisy amplifier 100 via the feedback filter 15.

Figure 7:
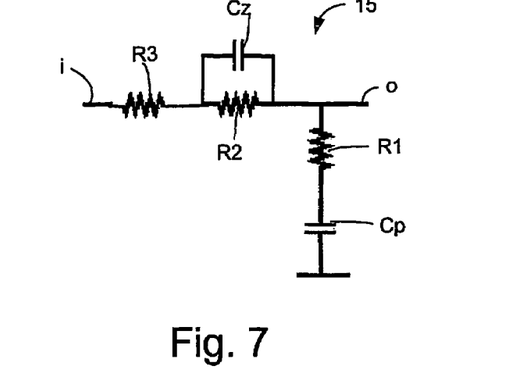
FIG. 7 illustrates the principle of a DC compensation feedback filter comprised in the present invention.

The principle of the feedback filter 15 is shown in FIG. 7. The feedback filter 15 comprises a large capacitor $C_p$ connected to grounding means and to a first resistor $R_1$. The resistor $R_1$ is connected in series with a second resistor $R_2$ coupled in parallel with a second capacitor $C_z$. The second resistor $R_2$ and the second capacitor $C_z$ are connected in series with a third resistor $R_3$ being coupled to the input terminal i of the filter 15. The output terminal O of the filter 15 is connected to the connection between the first and second resistors $R_1$, $R_2$.

The feedback filter 15 has two poles and zeros. The low-frequency pole time constant is governed by $\tau_{p1}=(R_3+R_2)C_p$, and the corresponding zero is governed by $\tau_{z1}=R_1C_p$. To provide phase compensation, $C_z$ is provided to insert a high-frequency phantom-zero. The low frequency pole sets the DC gain to unity, wherein the DC offset is minimized. Due to the low offset provided by the differential structure of the amplifiers, only the noisy amplifier 100 and the first amplifier 200 are inside the DC-feedback loop. This simplifies frequency compensation while still keeping the output offset at a reasonable value, on the order of 100 mV as discussed above. As should be noticed, the noise gain is not affected by the DC feedback due to the low-frequency pole.

Figure 8:
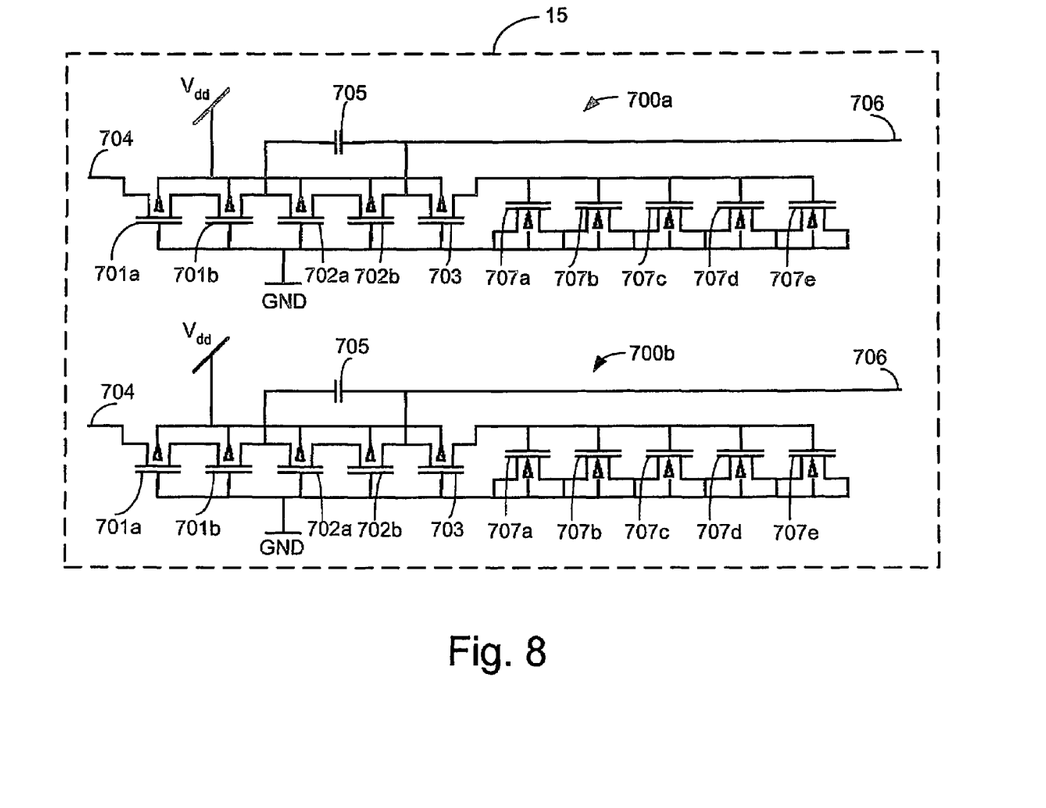
FIG. 8 is a more detailed illustration of one embodiment of the feedback filter of FIG. 7.

FIG. 8 illustrates one embodiment of the feedback filter 15 comprising first and second filters 700a and 700b. Each filter 700a, 700b is based on a chain of pass-transistors and gate capacitors. A cascade of five long-channel transistors 701a and 701b corresponding to $R_3$, 702a and 702b corresponding to $R_2$, and 703 corresponding to $R_1$ are provided using MOS transistors. Here, said transistors are provided as PMOS transistros. The bulks of the transistors 701a, 701b, 702a, 702b, 703 are connected to $V_{dd}$ and the gates are connected to grounding means. The source of transistor 701a is connected to input terminal 704. The drain of transistor 701a is connected to the source of the transistor 701b, the drain of the transistor 701b is connected to the source of the transistor 702a, the drain of the transistor 702a is connected to the source of the transistor 702b, and the drain of the transistor 702b is connected to the source of the transistor 703. Further a first terminal of a capacitor 705 corresponding to the capacitor $C_z$ is connected to the connection between the drain of the transistor 701b and the source of transistor 702a, and the second terminal of the capacitor 705 is connected to the connection between the drain of the transistor 702b and the source of the transistor 703 and to an output terminal 706.

The filter capacitor $C_p$ is built from a chain of five transistors 707a-707e using MOS transistors. Here, these transistors 707a-707e comprise NMOS transistors. The source, bulk and drain of the transistors 707a-707e are each connected to grounding means. Also, the gate of said transistors 705a-705e are connected to the drain of the transistor 703. The drain of said transistors 705a-705e are connected to the source of the following transistor, as can be seen in FIG. 8.

The long-channel transistors 701a, 701b, 702a, 702b, 703 are implemented as PMOS devices being sized to minimize the loading of the output stage of the first amplifier cell 200 and to maximize the filter time constant. Several transistors have been employed for modeling e.g. $R_2$, $R_3$, and $C_p$, as the MOS model is not good at handling the output conductance for long channel transistors. Also, some of the distributed effect model in the transistor will be lost. Therefore, in order not to stress the output conductance modeling too much, and to get some of the distributed gate effects modeled, several transistors are utilized. As should be noticed, a different number of pass devices may be employed in other embodiments of the invention. At large signal levels, the filter will be non-linear with a strong second order component. However, this non-linearity will be suppressed by the CM feedback of the amplifier cells 100, 200.

The filter capacitor $C_p$ is in the embodiment of FIG. 8 provided by five wide NMOS transistors 707a-707e connected in parallel in order not to lower the capacitor Q too much. The channel area of the transistors 705a-705e is in one embodiment approximately $A=5\cdot25$ μm$\cdot$5 μm=625 μpm$^2$, which corresponds to a capacitor size of approximately 6.25 pF.

In an alternative embodiment, any PMOS transistor of each filter 700a, 700b is replaced by a NMOS transistor and any NMOS transistor is replaced by a PMOS transistor, wherein the polarity of the filter will be switched.

The input terminal 704 of the first feedback filter 700a is connected to the second output terminal 205b of the first amplifier cell 200. The output terminal 706 of the first filter 700a is connected to the first input terminal 106a of the noisy amplifier 100. The input terminal 704 of the second feedback filter 700b is connected to the first output terminal 205a of the first amplifier cell 200 and the output terminal 706 of the second feedback filter 700b is connected to the second input terminal 106b of the noisy amplifier 100. Connecting the feedback filters 700a, 700b to the input terminals 106a, 106b of the noisy amplifier 100 will provide the short-circuiting of said input terminals AC-wise to grounding means via the filter capacitor $C_p$, i.e. transistors 707a-707e.

Providing two balanced DC feedback filters 700a, 700b makes the noisy amplifier settle very fast. The common mode component of the operating point (voltage) of the amplifiers has slow settling due to its large time constant ($\tau_{p1}=(R_3+R_2)C_p$), but because of symmetry between the noisy amplifier 100 and the first amplifier 200 the noise is available long before the common mode component has settled. The common mode feedback of said amplifiers keeps the output signal therefrom at a reasonable level although the feedback filters have not settled. Also, the first amplifier cell 200 will need no settling and will always be in the active region. The settling of the feedback filters is cophasal, wherein cophasal settling fluctuations are provided at the output terminals 205a, 205b of the first amplifier cell 200 during the settling of the feedback filters 700a, 700b. Therefore, the difference between the input signals fluctuation due to settling fluctuations extracted by the differential amplifier 300 is utilized for providing an amplified noise signal at the output terminal 305 of the second amplifier 300 although the settling is not stable. A typical single DC-feedback filter, which may be provided in an alternative embodiment of the invention, would not accomplish this. Further, the exemplifying oscillating means starts oscillating immediately when the device according to the invention is switched on, wherein the intrinsic noise of the oscillating means 13 together with the amplifier fluctuation differences are utilized to modulate the oscillating means before the feedback filters 700a, 700b have settled. Further, the differential feedback requires sufficient common mode rejection of the noisy amplifier 100 and the first amplifier cell 200 or they will become unstable because of the cross-coupled feedback (the first output terminal of the first amplifier cell 200 is connected to the second input terminal 106b of the noisy amplifier 100 via the second feedback filter 700b, and vice versa) resulting in a positive common mode feedback (but with loop-gain<<1).

By providing phantom-zero compensation using the capacitor CZ it is possible to only include the noisy amplifier 100 and the first amplifier cell 200 inside the DC feedback loop, while still maintaining sufficiently stability margin without inserting any forward path gain-shaping, such as a low-pass filter. This maximizes the noise amplifier gain and noise bandwidth, which contributes to a higher output noise level. Also, all 1/f noise from the second amplifier 300 will be fed to the following oscillator means 13, as said amplifier is outside the feedback filter 15, further improving the noise/interference ratio.

In FIG. 3 one principle of the exemplifying oscillating means 13 embodied as a VCO is shown. The oscillating means 13 has a ring oscillator structure, since ring oscillators are known for their poor noise properties, i.e. high noise levels, which are desirable when used together with the present invention. The oscillating means 13 comprises three oscillator amplifiers 400a, 400b, 440c, and a differential amplifier 500 corresponding to the differential amplifier 300 described above. As should be noticed, the oscillating means 13 could in an alternative embodiment be provided as a current controlled oscillator having a current input, wherein the amplifier 12 is provided with a current output terminal. The output terminal of the differential amplifier 500 will provide the random sequence of bits, which is generated by said amplifier.

Figure 9:
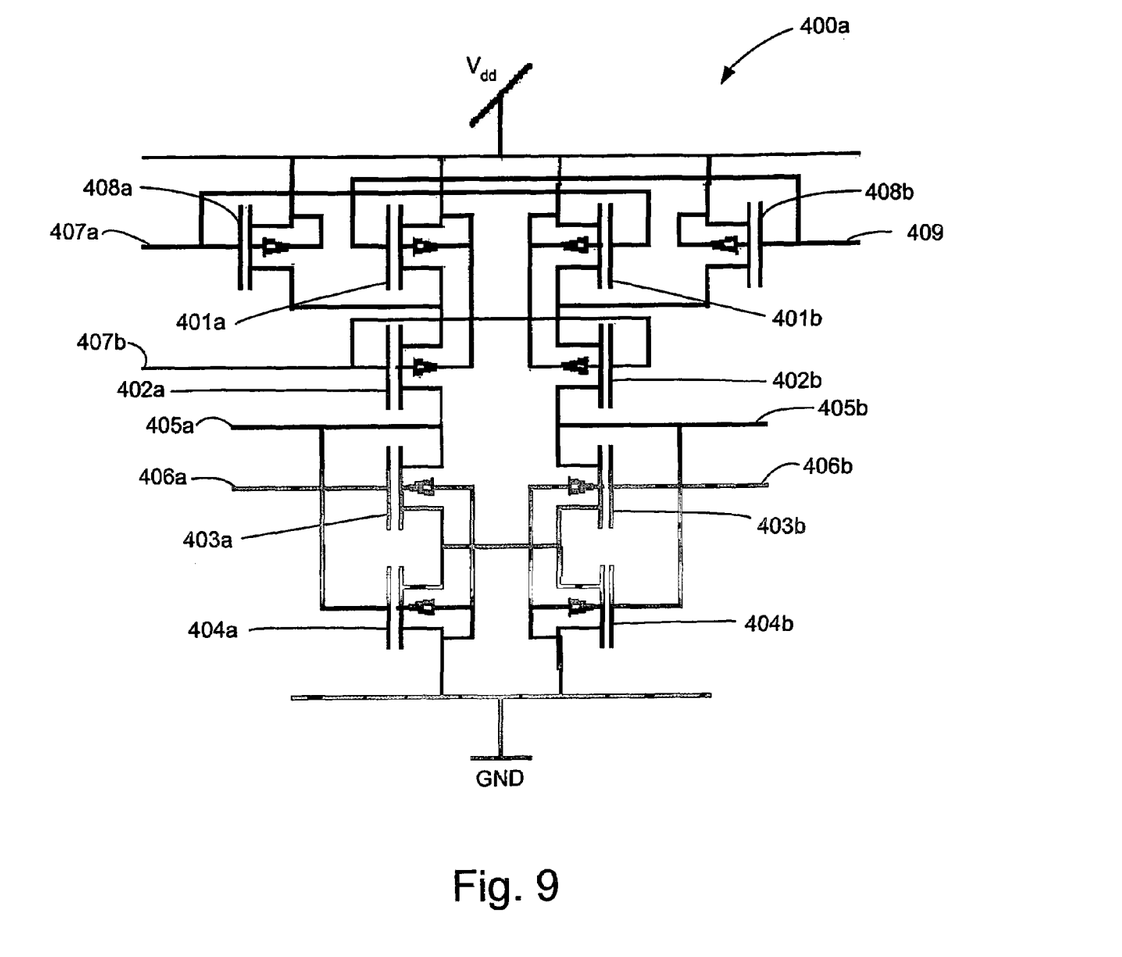
FIG. 9 is a detailed illustration of one embodiment of an oscillator amplifier of the exemplifying oscillating means of FIG. 2.

FIG. 9 illustrates the detailed design of one embodiment of the oscillator amplifier 400a. The oscillator amplifiers 400b and 400c correspond to the oscillator amplifier 400a. Therefore, in the following only oscillator amplifier 400a will be disclosed. The oscillator amplifier 400a is based on the basic amplifier cell 600 with some modifications. Therefore, like components of the basic amplifier cell 600 and the oscillator amplifier 400a are denoted by the like numerals. Consequently, the first transistor pair 601a, 601b of the basic amplifier cell 600 corresponds to a first transistor pair 401a, 401b of the oscillator amplifier 400a, the second transistor pair 602a, 602b, of the basic amplifier cell 600 corresponds to the second transistor pair 402a, 402b of the oscillator amplifier 400a, etc. However, there are some differences between the basic amplifier 600 and the oscillator amplifier 400a. To provide split bias, the oscillator amplifier 400a is provided with first and second biasing devices 408a, 408b. According to one embodiment, said biasing devices are provided as PMOS transistors. The gate of the first biasing device 408a is connected to a first bias $bias_1$ via the bias terminal 407a, the source and the bulk of said transistor are connected to $V_{dd}$, and the drain is connected to the connection between the drain of transistor 401a and the source of the transistor 402a. Also, the gate of the transistor 401b is connected to the first bias $bias_1$. The gate of the second biasing device 408b is connected to a third bias $bias_3$ via a third bias terminal 409, the source and the bulk of said transistor are connected to $V_{dd}$, and the drain is connected to the connection between the drain of the transistor 401b and the source of the transistor 402b, respectively. Also, the gate of the transistor 401a is connected to the third bias $bias_3$. All other connections of the oscillator amplifier 400a correspond to the connections according to the basic amplifier cell 600.

The tail-current sources 404a, 404b of the oscillator amplifier 400a provide low CM gain forcing said amplifier to oscillate differentially. The use of an odd number of oscillator amplifiers 400a-400c (i.e. three in this case) guarantees CM stability assuming the CM gain to be negative as discussed above. However, it should be noticed that an even number of oscillator amplifiers would work, in the differential sense, if feedback connections 450a, 450b provided between the output terminals 405a, 405b of the third oscillator amplifier 400c and the input terminals 406a, 406b of the first oscillator amplifier 400a, are cross coupled to provide a phantom negative feedback. Cophasal parasitic voltages accruing from the cross-coupling will be suppressed by the tail current sources 404a, 404b. However, when the feedback connections 450a, 450b are cross-coupled the feedback loop will have an unstable operating point (i.e. it will latch to $V_{dd}$ or ground) regardless of an even or odd number of amplifier stages. Therefore, an odd number of oscillator amplifiers have been chosen according to the preferred embodiment of the oscillating means 13.

A feature of the present invention is that the noise signal may be utilized for varying the bias voltage $bias_3$, which provides tuning of the oscillating means 13. With proper bias ($bias_1$, $bias_2$) of the oscillator amplifiers 400a, 400b, 400c the bias voltage $bias_3$ should have the same nominal value as input and output voltage quiescent points of the first and second amplifier cells 200, 300. It is important that the oscillating means 13 oscillates for all possible settings of the $bias_3$ to guarantee a random output bit stream to not provide long sequences of either only zeroes or ones. Also, if the oscillating means 13 is not oscillating for all possible settings of the bias $bias_3$, e.g. the settling time may be effected negatively. The output of the second amplifier 300, which is the amplified noise from the noisy amplifier 100, is utilized as the bias $bias_3$. The output terminal 305 of the second amplifier 300 is connected to the third bias terminal 409 of the oscillator amplifiers 400a-400c providing the modulation of the bias $bias_3$.

The first output terminal 17 of the bias means 16 provides the first bias voltage $bias_1$ and the second output terminal 18 provides the second bias voltage $bias_2$. The first output terminal 17 of the bias means 16 is connected to the first bias input terminal of the noisy amplifier 100, the first and second amplifier cells 200, 300, the oscillator amplifiers 400a-400c, and the differential amplifier 500. The second output terminal 18 of the bias means 16 is connected to the second bias input terminal of the noisy amplifier 100, the first and second amplifier 200, 300, and the oscillator amplifiers 400a-400c. The bias means 16 may be provided as an integrated circuit having similar device sizing as the amplifier cells to provide stable bias $bias_1$ and $bias_2$. The specific configuration of the bias means 16 may be provided by different designs as long as the appropriate first and second bias $bias_1$, $bias_2$ are provided. However, it is preferred if the bias means 16 may be provided together with the device for generating a noise signal 10 in the same integrated circuit.

The present invention has been described with reference to preferred and alternative embodiments. However, the present invention is not limited to the specific embodiments as described above, but is best defined by the following independent claims.

The invention claimed is:

1. A device for generating a noise signal, comprising:
   a noise source for generating intrinsic noise, the noise source further comprising:
   a noisy amplifier cell having amplifying means, wherein input terminals of the amplifying means of the noisy amplifier cell are short-circuited AC-wise to a grounding means;
   a load further comprising cascoded transistors coupled to the amplifying means and a power supply: and a tail-current source coupled to the grounding means and to the amplifying means.

2. The device according to, claim 1, wherein the load further comprising cascoded transistors comprise NMOS transistors, and the amplifying means and the tail-current source comprises PMOS transistors.

3. The device according to claim 2, wherein the width-over-length ratio of the transistors of the amplifying means is at least 3 times the width-over-length ratio of the transistors of the tail-current source, and the width-over-length ratio of the second transistor pair of the load is at least 3 times the size of the width-over-length ratio of the first transistor pair of the load.

4. The device according to claim 2, wherein the width of the transistors of the amplifying means and the transistors of the second transistor pair of the load is in the range of 2.5-125 μm, and the length of the transistors is in the range of 0.25-12.5 μm; the width and the length of the transistors of the tail-current source and the transistors of the first transistor pair of the load are in the range of 0.25-12.5 μm.

5. The device according to claim 1, wherein the gate-overdrive voltage of the amplifier means is approximately 100mV.

6. A device for generating a noise signal, comprising:
a noise source for generating intrinsic noise, the noise source further comprising: a noisy amplifier cell having amplifying means;
a first amplifier cell being DC coupled to the noisy amplifier cell;
the output terminals of the noisy amplifier cell coupled to respective input terminals of the first amplifier;
a DC compensation loop having a feedback filter coupled to the output terminals of the first amplifier and to the input terminals of the noisy amplifier, respectively;
a load further comprising cascoded transistors coupled to the amplifying means and a power supply; and
a tail-current source coupled to grounding means and to the amplifying means.

7. The device according to claim 6, wherein the feedback filter comprises first and second filters each comprising a high-frequency phantom zero capacitor providing phase compensation.

8. The device according to claim 6, wherein the feedback filter comprises two filters each comprising a first capacitor coupled to grounding means and a first resistor coupled to the output terminal of the filter, a second resistor in parallel to the high-frequency phantom zero Gapacitor coupled to the output terminal of the filter and to a third resistor being coupled to the input terminal of the filter.

9. The device according to claim 8, wherein the first capacitor, the first resistor, the second resistor, the high-frequency phantom zero capacitor, and the third resistor comprises MOS transistors.

10. The device according to claim 8, wherein the first capacitor comprises NMOS transistors, and the first resistor, the second resistor, and the third resistor comprises PMOS transistors.

11. The device according to claim 8, wherein the first capacitor comprises PMOS transistors, and the first resistor, the second resistor, and the third resistor comprises NMOS transistors.

12. The device according to claim 6, further comprising:
a noise source output terminal;
a random generating sequence device for generating a random sequence of bits coupled to the noise source output terminal;
the random generating sequence device further comprising:
oscillating means having an input terminal for receiving a bias as input, the oscillating means coupled to the noise source output terminal, the oscillating means further comprising at least one oscillator amplifier; amplifying means comprising at least one a differential amplifier coupled to a corresponding the at least one oscillator amplifier;
a load coupled to the amplifying means and to a power supply, the load being adapted to protect the amplifying means from interfering signals; and
a tail current source coupled to the amplifying means and grounding means.

13. The device of claim 6, further comprising an electronic apparatus for generating a noise signal.

14. The device according to claim 13, wherein the electronic apparatus is one from the group consisting of a mobile radio terminal, a pager, a communicator, an electronic organizer and a smartphone.

15. The electronic apparatus according to claim 13, wherein the apparatus is a mobile telephone.

16. The device according to claim 6, the device being fabricated on an integrated circuit.

17. The device according to claim 6, wherein the width-over-length ratio of the transistors of the amplifying means is at least 3 times the width-over-length ratio of the transistors of the tail-current source, and the width-over-length ratio of the second transistor pair of the load is at least 3 times the size of the width-over-length ratio of the first transistor pair of the load.

18. The device according to claim 6 wherein the width of the transistors of the amplifying means and the transistors of the second transistor pair of the load is in the range of 2.5-125 μm, and the length of the transistors is in the range of 0.25-12.5 μm; the width and the length of the transistors of the tail-current source and the transistors of the first transistor pair of the load are in the range of 0.25-12.5 μm.

19. The device according to claim 6, wherein the gate-overdrive voltage of the amplifier cell is approximately 100mV.

* * * * *

UNITED STATES PATENT AND TRADEMARK OFFICE
CERTIFICATE OF CORRECTION

PATENT NO.         : 7,511,586 B2
APPLICATION NO. : 10/550827
DATED                 : March 31, 2009
INVENTOR(S)        : Mattisson It is certified that error appears in the above-identified patent and that said Letters Patent is hereby corrected as shown below:

In Column 8, Line 46, Equation 5, delete " $\sigma_{V_T} \sim nV / \sqrt{W \cdot L_{eff}}$ " and insert -- $\sigma_{V_T} \sim 2nV / \sqrt{W \cdot L_{eff}}$ --, therefor.

In Column 11, Lines 40-41, delete "transistros." and insert -- transistors. --, therefor.

In Column 14, Line 67, in Claim 1, delete "supply:" and insert -- supply; --, therefor.

In Column 15, Line 3, in Claim 2, delete "to," and insert -- to --, therefor.

In Column 15, Line 48, in Claim 8, delete "Gapacitor" and insert -- capacitor --, therefor.

Signed and Sealed this

Twenty-seventh Day of October, 2009

David J. Kappos
*Director of the United States Patent and Trademark Office*